United States Patent
Mizutani et al.

(10) Patent No.: US 7,423,362 B2
(45) Date of Patent: Sep. 9, 2008

(54) PIEZOELECTRIC TRANSFORMER DRIVE METHOD AND DRIVE CIRCUIT

(75) Inventors: Akira Mizutani, Saitama (JP); Yasuhide Matsuo, Saitama (JP)

(73) Assignee: Tamura Corporation, Tokyo (JP)

( * ) Notice: Subject to any disclaimer, the term of this patent is extended or adjusted under 35 U.S.C. 154(b) by 520 days.

(21) Appl. No.: 10/558,483

(22) PCT Filed: May 28, 2004

(86) PCT No.: PCT/JP2004/007730

§ 371 (c)(1),
(2), (4) Date: Nov. 28, 2005

(87) PCT Pub. No.: WO2004/107548

PCT Pub. Date: Dec. 9, 2004

(65) Prior Publication Data

US 2007/0013267 A1    Jan. 18, 2007

(30) Foreign Application Priority Data

May 29, 2003    (JP) ............................. 2003-153283

(51) Int. Cl.
*H01L 41/04* (2006.01)
(52) U.S. Cl. ...................... 310/318; 310/359
(58) Field of Classification Search ................ 310/318, 310/359
See application file for complete search history.

(56) References Cited

U.S. PATENT DOCUMENTS

| | | | |
|---|---|---|---|
| 5,866,969 A | | 2/1999 | Shimada et al. |
| 5,969,963 A | * | 10/1999 | Ohnishi et al. ............... 363/132 |
| 6,087,757 A | * | 7/2000 | Honbo et al. ................. 310/318 |
| 6,144,139 A | | 11/2000 | Noma et al. |
| 6,198,198 B1 | * | 3/2001 | Fujimura et al. ........ 310/316.01 |
| 6,239,558 B1 | | 5/2001 | Fujimura et al. |
| 6,342,753 B1 | * | 1/2002 | Oliver et al. ................. 310/359 |
| 6,348,755 B1 | * | 2/2002 | Shimamura et al. .......... 310/359 |
| 6,407,480 B1 | * | 6/2002 | Nakanishi et al. ....... 310/316.01 |

(Continued)

FOREIGN PATENT DOCUMENTS

CN    1235708    11/1999

(Continued)

OTHER PUBLICATIONS

English Language Abstract of JP 8-032134.

(Continued)

*Primary Examiner*—J. A San Martin
(74) *Attorney, Agent, or Firm*—Greenblum & Bernstein, P.L.C.

(57) ABSTRACT

A driving circuit is composed of a discontinuous rectangle wave oscillator and a lowpass filter. A discontinuous rectangle wave used herein is composed of voltages Vp, 0 and −Vp. Assuming one cycle is T, a discontinuous rectangle wave has such a configuration that a potential from a time 0 to a time ø is a potential 0, from the time ø to a time (T/6−ø) is a potential Vp, from the time (T/6−ø) to a time (T/3+ø) is a potential 0, .... Since the third harmonic wave is not included in the discontinuous waveform, the inductance of the lowpass filter can be reduced. Consequently, the lowpass filter may be omitted. Further, the amplitude of the fundamental wave can be changed by varying the phase difference ø.

14 Claims, 9 Drawing Sheets

U.S. PATENT DOCUMENTS

| | | | |
|---|---|---|---|
| 6,794,796 B2 * | 9/2004 | Nakatsuka et al. | 315/209 PZ |
| 7,034,800 B2 * | 4/2006 | Nakatsuka et al. | 310/314 |
| 7,279,995 B2 * | 10/2007 | Kernahan et al. | 331/57 |
| 2004/0017365 A1 * | 1/2004 | Hatano et al. | 345/204 |

FOREIGN PATENT DOCUMENTS

| | | | |
|---|---|---|---|
| CN | 1250348 | | 4/2000 |
| DE | 69704082 | | 9/2001 |
| EP | 0922324 | | 6/1999 |
| HK | 1031279 | | 10/1999 |
| JP | 8-032134 | | 2/1996 |
| JP | 10-127057 | | 5/1998 |
| JP | 10-223388 | | 8/1998 |
| JP | 2000-116141 | | 4/2000 |
| JP | 2001093691 A | * | 4/2001 |
| JP | 2002-319499 | | 10/2002 |
| JP | 2003-033046 | | 1/2003 |
| KR | 10-246151 | | 7/1998 |
| WO | 98/09369 | | 3/1998 |

OTHER PUBLICATIONS

English Language Abstract of 10-223388.
English Language Abstract of JP 10-127057.
English Language Abstract of JP 2003-033046.
English Language Abstract of JP 2000-116141.

* cited by examiner

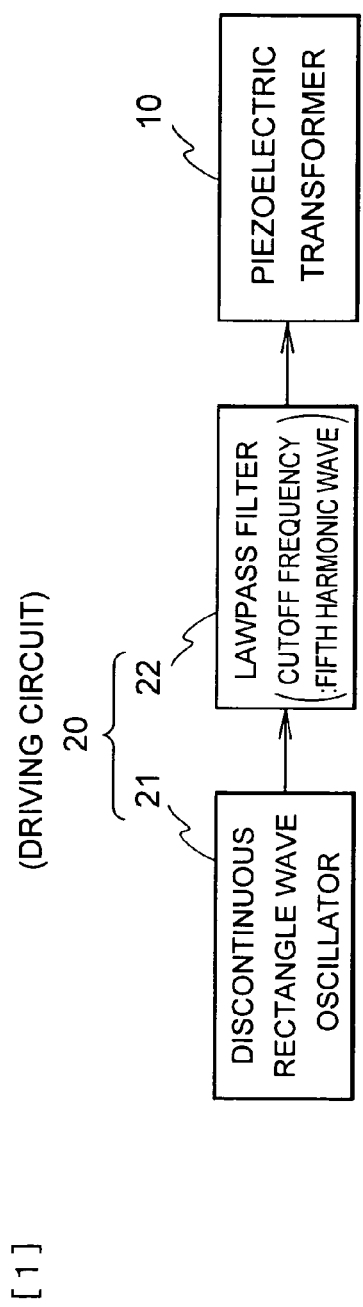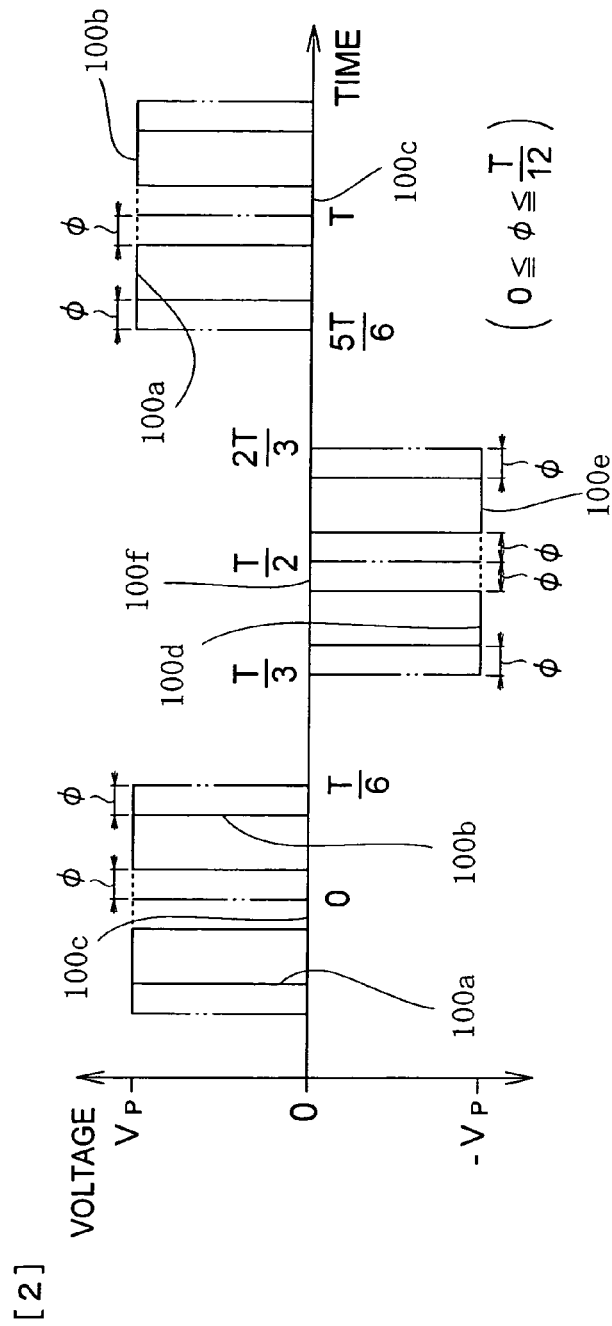

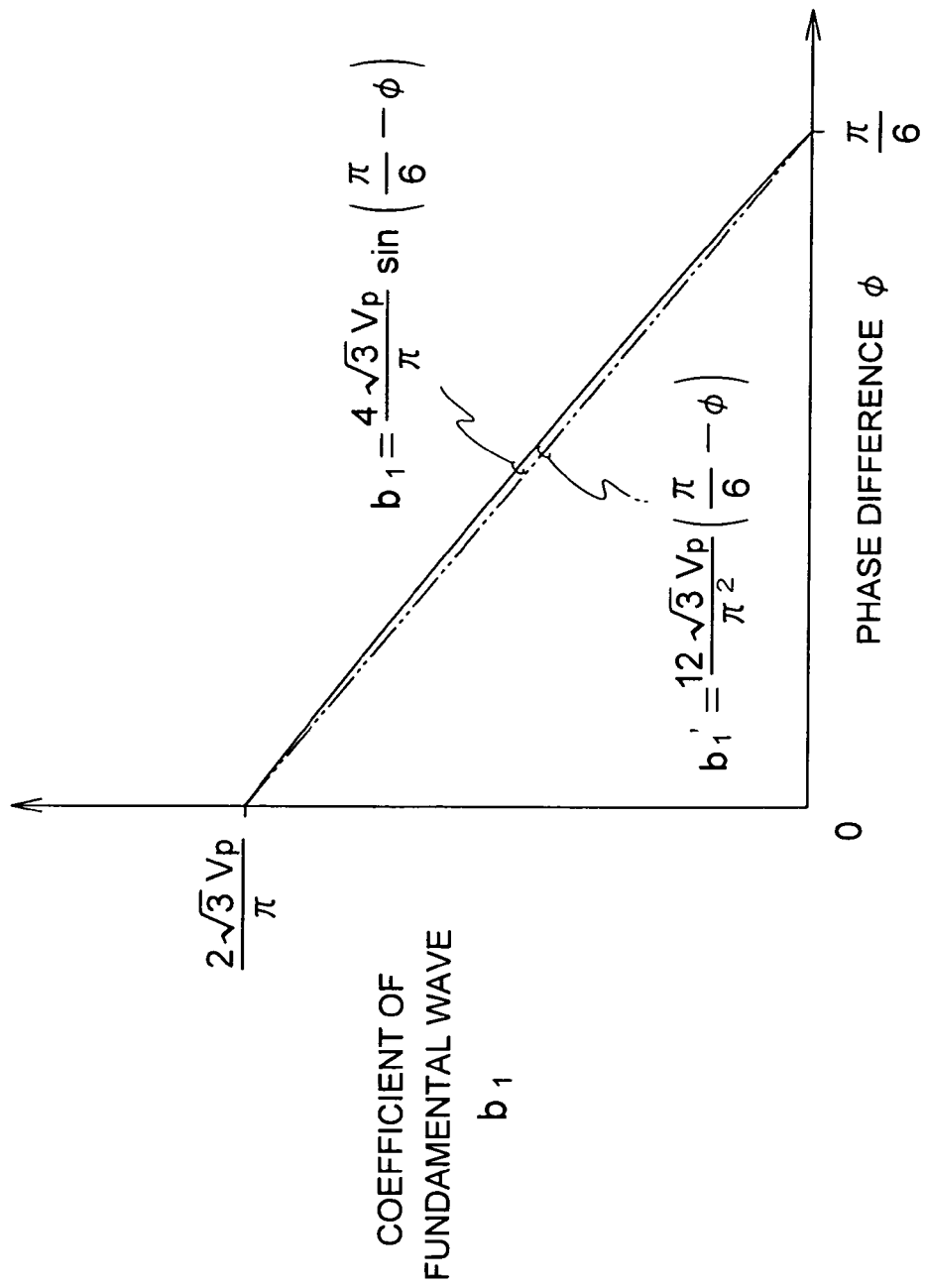

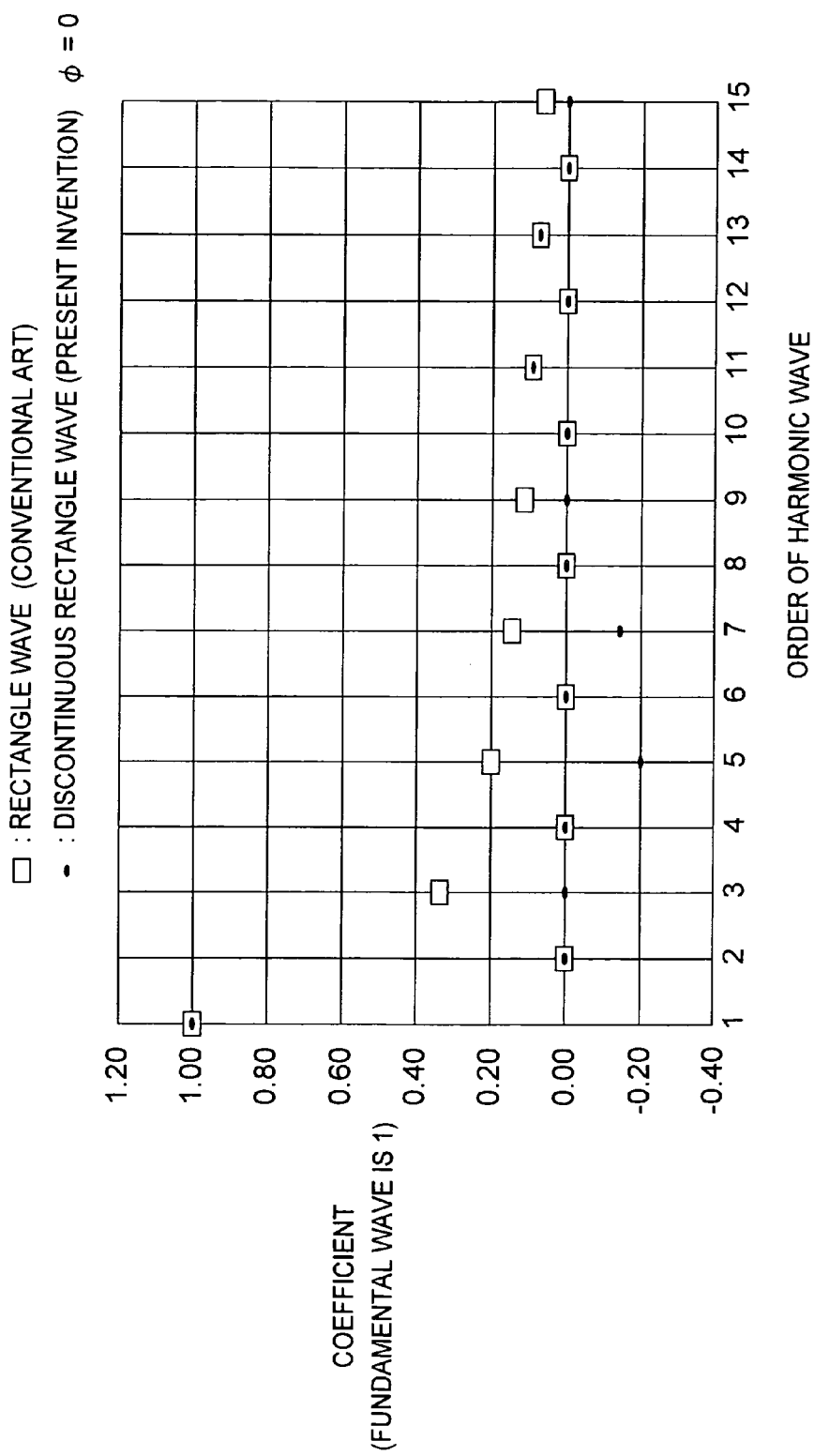

FIG. 8
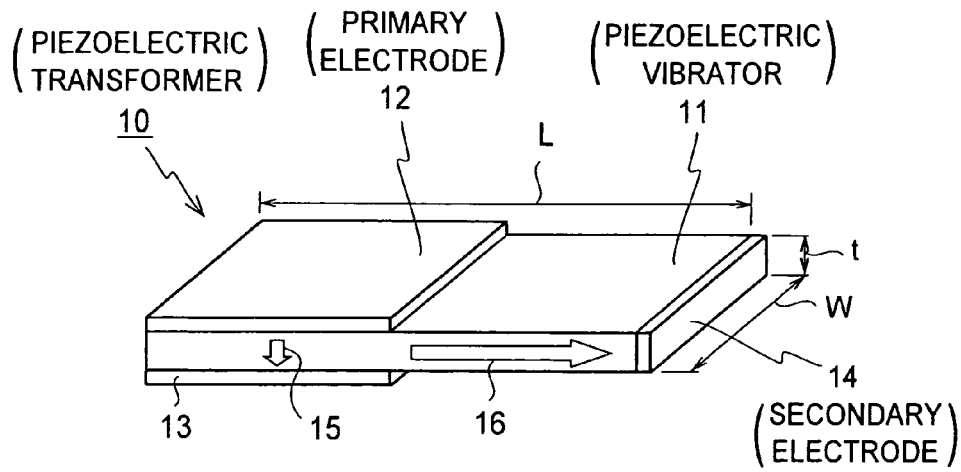
[2]
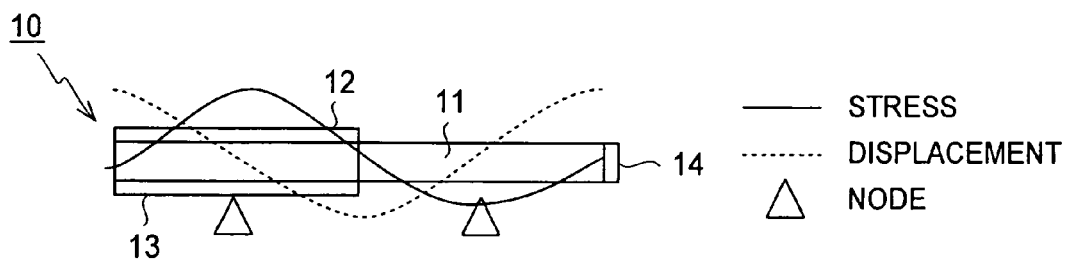
— STRESS
···· DISPLACEMENT
△ NODE
[3]
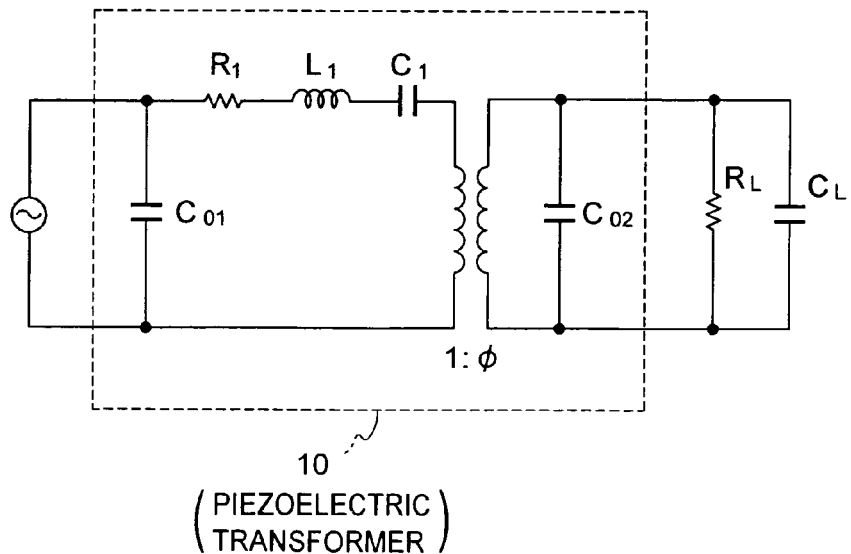

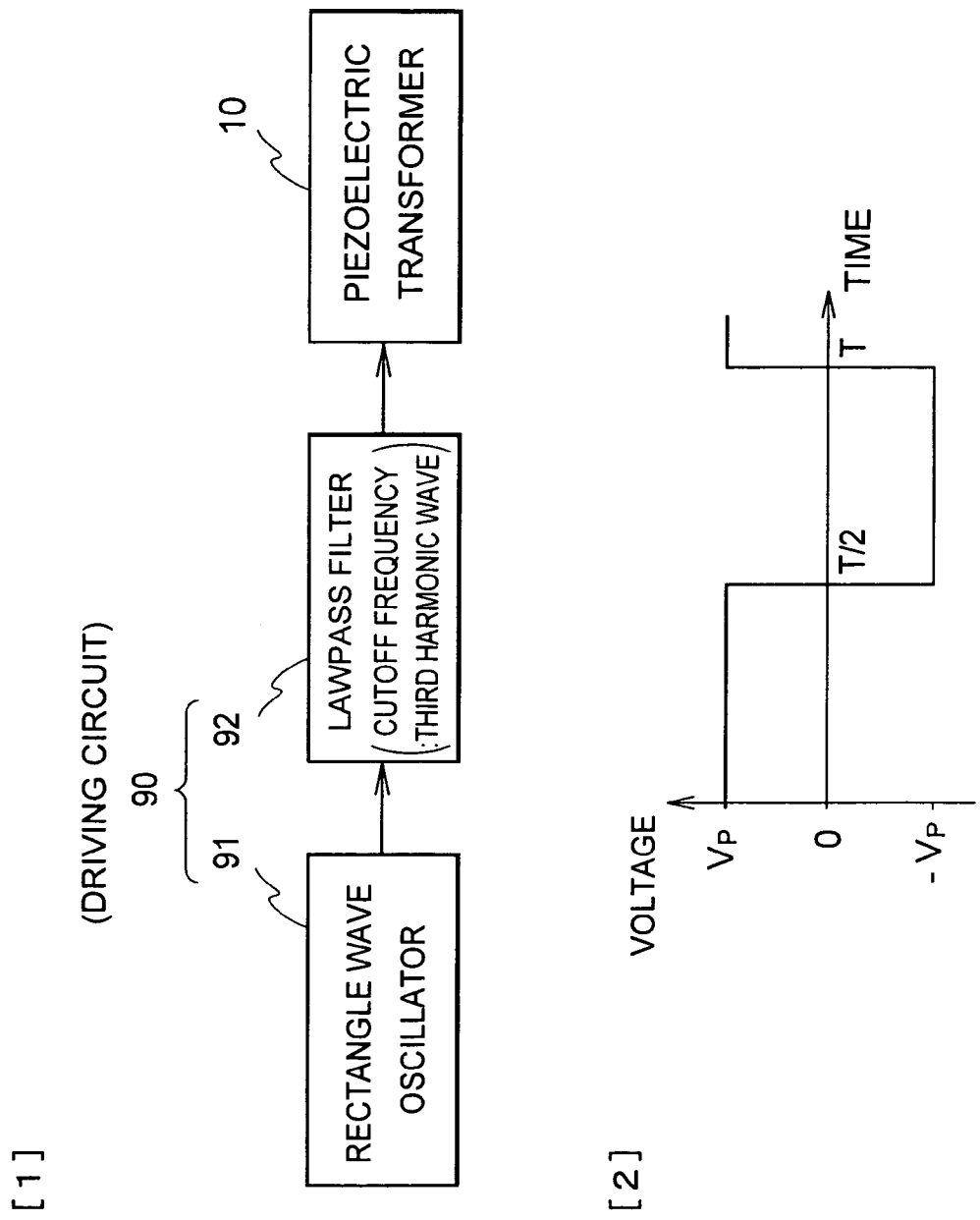

… (1)

PIEZOELECTRIC TRANSFORMER DRIVE METHOD AND DRIVE CIRCUIT

TECHNICAL FIELD

The present invention relates to a driving method and a driving circuit of a piezoelectric transformer which transforms AC voltage by utilizing a resonance phenomenon of a piezoelectric vibrator.

BACKGROUND ART

A piezoelectric transformer (solid former) is configured to input low voltage and output high voltage by utilizing a resonance phenomenon of a piezoelectric vibrator (see, for example, Patent Document 1). A characteristic of a piezoelectric transformer is that the energy density of a piezoelectric vibrator is higher comparing with an electromagnetic type. Therefore, the size can be reduced, whereby piezoelectric transformers are used for cold-cathode tube lighting, liquid crystal backlight lighting, a small AC adapter, a small high-voltage power source, and the like.

FIG. 8 shows a piezoelectric transformer, in which FIG. 8 is a perspective view, FIG. 8 is a side view, and FIG. 8 is an equivalent circuit diagram. Hereinafter, explanation will be given based on these Figs.

A piezoelectric transformer 10 includes primary electrodes 12 and 13 and a secondary electrode 14 on a piezoelectric vibrator 11, and the primary side is polarized in a thickness direction (arrow 15) and the secondary side is polarized in a length direction (arrow 16). The primary electrodes 12 and 13 are opposite each other sandwiching the piezoelectric vibrator 11. The piezoelectric vibrator 11 is in a plate shape (rectangular parallelepiped shape) having the length L, the width W and the thickness t. In the length direction of the piezoelectric vibrator 11, the primary electrodes 12 and 13 are provided from one end to L/2 in a width direction, and the secondary electrode 14 is provided in a thickness direction on the other end. When the voltage of a natural resonance frequency fr determined by the length dimension is inputted into the primary side of the piezoelectric transformer, intense mechanical vibration is caused in the piezoelectric transformer due to the inverse piezoelectric effect of the piezoelectric transformer, and with the piezoelectric effect thereof, an intense voltage Vo appropriate to the vibration is outputted to the secondary side.

The distribution of displacement and stress at the time of driving the piezoelectric transformer 10 is shown in FIG. 8. Parts holding the piezoelectric vibrator 11 are nodes located at positions which are ¼ of the length from both ends in the case of λ mode. An equivalent circuit in the vicinity of the resonance frequency fr of the piezoelectric transformer 10 can be written as shown in FIG. 8.

[Patent Document 1]
Japanese Patent Application Laid-open No. 8-32134

DISCLOSURE OF THE INVENTION

Problems to be Solved by the Invention

FIG. 9 shows a driving circuit of a conventional piezoelectric transformer, in which FIG. 9 is a functional block diagram, and FIG. 9 shows an output waveform of a rectangle wave oscillator. Hereinafter, explanation will be given based on FIGS. 8 and 9.

A driving circuit 90 basically consists of a rectangle wave oscillator 91 and a lowpass filter 92. The lowpass filter 92 removes harmonic components included in the rectangle wave voltage outputted from the rectangle wave oscillator 91 to thereby apply a waveform close to a sine wave to the piezoelectric transformer 10.

Fourier series of a rectangle wave (or may be called a square wave) shown in FIG. 9 is given by the following formula [2].

$$(4Vp/\pi) [\sin \omega t + (\frac{1}{3})\sin 3\omega t + (\frac{1}{5})\sin 5\omega t + \ldots + \{1/(2n+1)\}\sin(2n+1)\omega t + \ldots] \quad [2]$$

As obvious from the formula [2], harmonic waves other than the fundamental wave included in the rectangle wave are removed, so the cutoff frequency of the lowpass filter 92 is generally set to the third harmonic wave. Since such a low cutoff frequency is required to be set, the inductance of the lowpass filter 92 must be large. However, there is a problem that an inductor having a large inductance is large in its dimensions, heavy and expensive.

Further, from the formula [2], the fundamental wave is shown as $(4Vp/\pi)\sin \omega t$. Therefore, in order to change the amplitude of the fundamental wave, a DC-DC converter for causing the voltage Vp to be variable is needed, which makes the configuration complicated.

In view of the above, an object of the present invention is to provide a driving method and a driving circuit of a piezoelectric transformer, capable of reducing the inductance of a lowpass filter and also changing the amplitude of the fundamental wave without using a DC-DC converter.

Means for Solving the Problems

A driving method of a piezoelectric transformer according to the present invention is to apply the voltage of a discontinuous rectangle wave to primary electrodes of the piezoelectric transformer. A driving circuit of a piezoelectric transformer according to the present invention is one having a discontinuous rectangle wave oscillator which outputs the voltage of a discontinuous rectangle wave which is applied to primary electrodes of the piezoelectric transformer.

A discontinuous rectangle wave used herein has the following characteristics [1] to [3]. [1] It consists of a potential $V_0$, a potential $V_H$ which is higher than the potential $V_0$, and a potential $V_L$ which is lower than the potential $V_0$. [2] Assuming one cycle is T, the discontinuous rectangle wave has a such configuration that a potential from a time 0 to a time ø is the potential $V_0$, from the time ø to a time (T/6−ø) is the potential $V_H$, from the time (T/6−ø) to a time (T/3+ø) is the potential $V_0$, from the time (T/3+ø) to a time (T/2−ø) is the potential $V_L$, from the time (T/2−ø) to a time (T/2+ø) is the potential $V_0$, from the time (T/2+ø) to a time (2T/3−ø) is the potential $V_L$, from the time (2T/3−ø) to a time (5T/6+ø) is the potential $V_0$, from the time (5T/6+ø) to a time (T−ø) is the potential $V_H$, and from the time (T−ø) to a time T is the potential $V_0$. [3] The phase difference ø is $0 \leq ø \leq T/12$.

It is preferable that a discontinuous rectangle wave used herein has the following characteristics [1] to [3]. [1] It consists of a potential 0, a potential +1 which is higher by a certain voltage than the potential 0, and a potential −1 which is lower by a certain voltage than the voltage 0. [2] Assuming one cycle is T, the discontinuous rectangle wave has a such configuration that a potential from a time 0 to a time ø is the potential 0, from the time ø to a time (T/6−ø) is the potential +1, from the time (T/6−ø) to a time (T/3+ø) is the potential 0, from the time (T/3+ø) to a time (T/2−ø) is the potential −1, from the time (T/2−ø) to a time (T/2+ø) is the potential 0, from the time (T/2+ø) to a time (2T/3−ø) is the potential −1, from the time (2T/3−ø) to a time (5T/6+ø) is the potential 0, from the time (5T/6+ø) to a time (T−ø) is the potential +1, and from the time (T−ø) to a time T is the potential 0. [3] The phase difference ø is $0 \leq ø \leq T/12$.

As obvious from the formula [2], assuming the coefficient of the fundamental wave is 1, a rectangle wave (conventional art) consists of the fundamental wave+(⅓)third harmonic wave+(⅕)fifth harmonic wave+ . . . . That is, in a rectangle wave, the third harmonic wave occupies the most among the harmonic waves. Thereby, a lowpass filter in which the third harmonic wave is the cutoff frequency is required.

On the other hand, a discontinuous rectangle wave (present invention) does not include the third harmonic wave as described later, so the inductance of the lowpass filter can be small. For example, the inductance of the lowpass filter in which the fifth harmonic wave is the cutoff frequency is sufficient. Further, as described later, the amplitude of the fundamental wave can be changed by varying the phase difference ø, whereby a DC-DC converter is not required. Note that assuming the coefficient of the fundamental wave is 1, a discontinuous rectangle wave when ø is 0 is so configured as the fundamental wave+(−⅕)fifth harmonic wave+(⅐)seventh harmonic wave+ . . . .

BRIEF DESCRIPTION OF THE DRAWINGS

FIG. 1 shows an embodiment of a driving circuit of a piezoelectric transformer according to the present invention, in which FIG. 1 is a functional block diagram, and FIG. 1 shows an output waveform of a discontinuous rectangle wave oscillator.

FIG. 2 is a graph showing the relationship between the phase difference and the coefficient of the fundamental wave in the driving circuit of FIG. 1.

FIG. 3 is a graph showing harmonic components of a rectangle wave (conventional art) and a discontinuous rectangle wave (present invention).

FIG. 8 shows a piezoelectric transformer, in which FIG. 8 is a perspective view, FIG. 8 is a side view, and FIG. 8 is an equivalent circuit diagram.

FIG. 9 shows a driving circuit of a conventional piezoelectric transformer, in which FIG. 9 is a functional block diagram, and FIG. 9 shows an output waveform of a rectangle wave oscillator.

Figure 4:
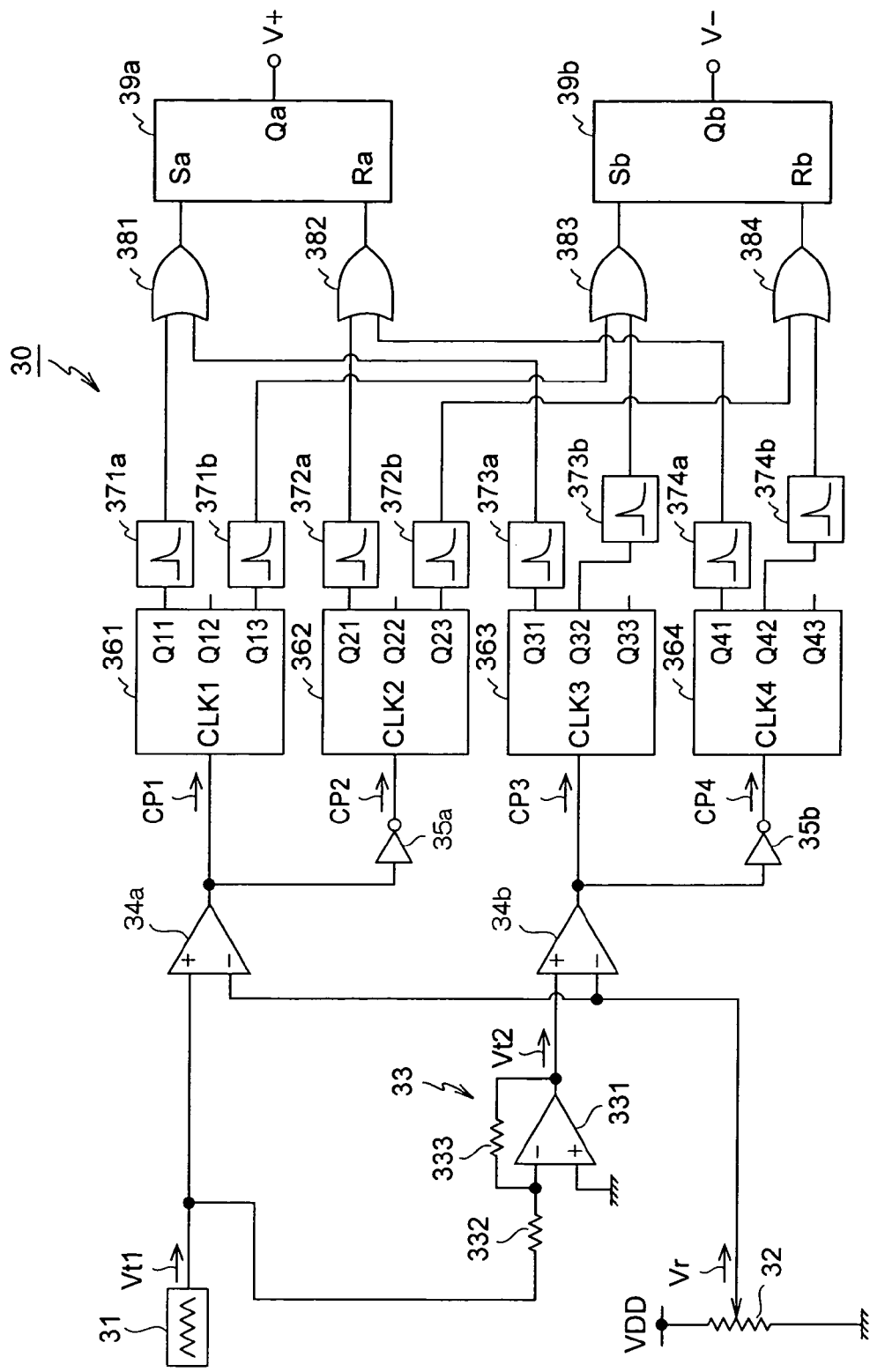
FIG. 4 is a circuit diagram showing an example of an oscillating unit in the driving circuit of FIG. 1.

Hereinafter, as for a driving method and a driving circuit of a piezoelectric transformer according to the present invention, embodiments thereof will be explained with reference to the drawings. Since the driving method according to the present invention is used for the driving circuit according to the present invention, it will be explained together with the explanation about an embodiment of the driving circuit according to the present invention.

FIG. 1 shows an embodiment of a driving circuit of a piezoelectric transformer according to the present invention, in which FIG. 1 is a functional bock diagram, and FIG. 1 shows an output waveform of a discontinuous rectangle wave oscillator. FIG. 2 is a graph showing the relationship between the phase difference and the coefficient of the fundamental wave in the driving circuit of FIG. 1. FIG. 3 is a graph showing harmonic components of exemplary rectangle wave (conventional art) and discontinuous rectangle wave (present invention). Hereinafter, explanation will be given based on FIGS. 1 to 3. Since the piezoelectric transformer is the same as that of the conventional art, the explanation is omitted.

As shown in FIG. 1, a driving circuit 20 of the present embodiment consists of a discontinuous rectangle wave oscillator 21 and a lowpass filter 22. The lowpass filter 22 is provided between the rectangle wave oscillator 21 and the piezoelectric transformer 10. The lowpass filter 22 removes harmonic components included in the discontinuous rectangle wave voltage outputted from the discontinuous rectangle wave oscillator 21 to thereby apply a waveform close to a sine wave to the piezoelectric transformer 10. Note that the discontinuous rectangle wave oscillator 21 includes an oscillating unit (FIG. 4) for outputting discontinuous rectangle wave generation signals, and a driving unit (FIG. 7) for applying voltage generated by a discontinuous rectangle wave based on the discontinuous rectangle wave generation signals to primary electrodes of the piezoelectric transformer 10.

The driving method of a piezoelectric transformer according to the present invention is characterized in that, as the basic configuration, in a pulse generating step, the driving pulse of the fundamental wave is generated by alternating the polarities of rectangle pulses 100a, 100b, 101d and 101e, in a double-humped shape, forming a unit, and then in a voltage applying step, a voltage based on the driving pulse of the fundamental wave generated in the pulse generating step is applied to primary electrodes of the piezoelectric transformer 10. Note that the driving pulse in which the amplitude is changed may be generated by varying the phase difference (ø) with respect to the fundamental wave. Further, frequency components not less than the fifth harmonic wave, included in the driving pulse, may be filtered.

Figure 7:
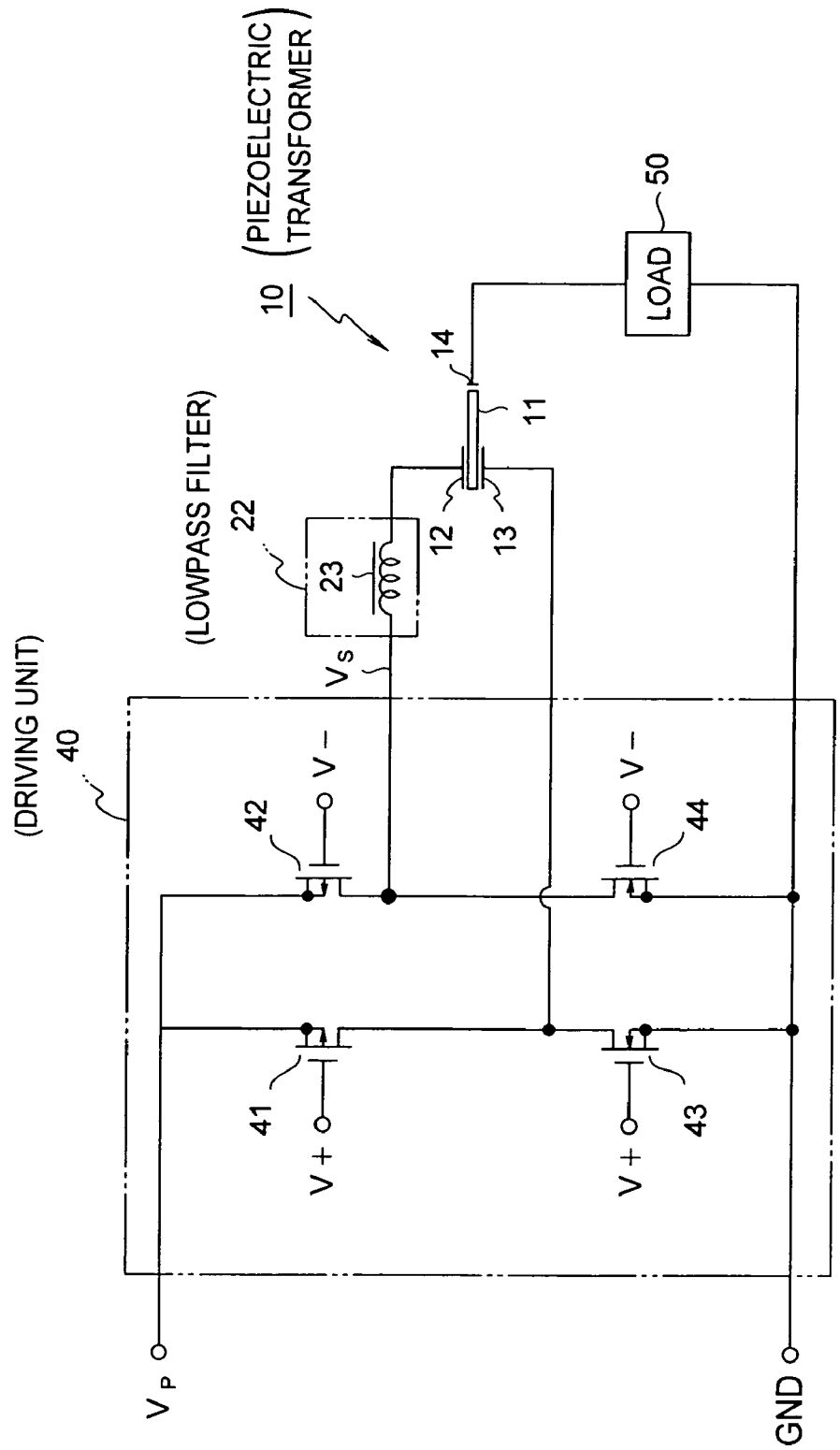
FIG. 7 is a circuit diagram showing an example of a driving unit in the driving circuit of FIG. 1.

A driving circuit of a piezoelectric transformer for carrying out the driving method of a piezoelectric transformer according to the present invention includes an oscillating unit (FIG. 4) and a driving unit (FIG. 7).

As shown in FIG. 1, the oscillating unit (FIG. 4) generates the driving pulse of the fundamental wave by alternating the polarities of the rectangle pulses 100a and 100b, and 100d and 100e, in a double-humped shape, forming a unit. Note that the oscillating unit (FIG. 4) has a function of generating the driving pulse in which the amplitude is changed by varying the phase difference (ø) with respect to the fundamental wave.

Based on FIG. 1, the rectangle pulses 100a and 100b, and 100d and 100e, in a double-humped shape, constituting the driving pulse of the fundamental wave will be explained. The rectangle pulses 100a, 100b, 100d and 100e are double-humped shaped, and the rectangle pulses 100a and 100b and the rectangle pulses 100d and 100e are different in their polarities. That is, the polarity of the rectangle pulses 100a and 100b show positive, and the rectangle pulses 100d and 100e show negative. The rectangle pulses 10a and 10b, in a double-humped shape, have a voltage value of +Vp, and the voltage value of a rectangle pulse 100c between the rectangle pulses 100a and 100b, in a double-humped shape, is 0. On the other hand, the rectangle pulses 100d and 100e, in a double-humped shape, have the voltage value of −Vp, and the voltage value of a rectangle pulse 100f between the rectangle pulses 100d and 100e, in a double-humped shape, is 0.

The driving unit (FIG. 7) applies a voltage based on the driving pulse of the fundamental wave generated in the oscillating unit (FIG. 4) to primary electrodes of the piezoelectric transformer 10. Note that the lowpass filter 22 for filtering frequency components not less than the fifth harmonic wave included in the driving pulse may be provided.

Further, the driving pulse as a discontinuous rectangle wave will be explained in detail. As shown in FIG. 1, a discontinuous rectangle wave (driving pulse) used here has the characteristics shown in [1] to [3] below. [1]. It consists of potentials Vp, 0, –Vp. [2]. Assuming one cycle is T, it has such a configuration that the potential from a time 0 to a time ø is a potential 0, from the time ø to a time (T/6–ø) is a potential Vp, from the time (T/6–ø) to a time (T/3+ø) is a potential 0, from the time (T/3+ø) to a time (T/2–ø) is a potential –Vp, from the time (T/2–ø) to a time (T/2+ø) is a potential 0, from the time (T/2+ø) to a time (2T/3–ø) is a potential –Vp, from the time (2T/3–ø) to a time (5T/6+ø) is a potential 0, from the time (5T/6+ø) to a time (T–ø) is a potential Vp, and from the time (T–ø) to a time T is a potential 0. [3]. ø is 0<ø<T/12. As described above, the driving circuit 20 uses the driving method according to the present invention.

Next, the discontinuous rectangle wave shown in FIG. 1 is expressed in a function y(t) of the time (t), and is developed into the Fourier series. If ω=2π/T, y(t) is shown as follows:

$$y(t) = b_0 + \sum_{n=1}^{\infty} b_n \cos n\omega t + \sum_{n=1}^{\infty} a_n \sin n\omega t \quad (1)$$

Here, as shown in FIG. 1, since y(t+T/2)=–y(t) is established, y(t) is a symmetrical wave. Therefore, $b_0$ is 0, and n is an odd number only, and integration may be from 0 to T/2. Further, since y(t)=–y(t) is established, y(t) is an even function, whereby the term of sin does not exist in the equation (1). That is, $a_n$ is 0.

Therefore, y(t) can be shown as follows:

$$y(t) = \sum_{n=1}^{\infty} b_n \cos n\omega t \quad (2)$$

Next, the coefficient $b_n$ in the equation (2) is calculated.

$$b_n = 2/\pi \int_0^{T/2} y(t)\cos n\omega t\, dt \quad (3)$$

$$= 2/\pi \left( \int_\phi^{\pi/3-\phi} Vp\cos n\omega t\, dt - \int_{2\pi/3+\phi}^{\pi-\phi} Vp\cos n\omega t\, dt \right)$$

$$= 2Vp/(n\pi)\left([\sin n\omega t]_\phi^{\pi/3-\phi} - [\sin n\omega t]_{2\pi/3+\phi}^{\pi-\phi}\right)$$

$$= 2Vp/(n\pi)\left\{ \begin{array}{l} \sin(n\pi/3 - n\phi) - \sin n\phi - \sin \\ (n\pi - n\phi) + \sin(2n\pi/3 + n\phi) \end{array} \right\}$$

From the equation (3), $b_1$, $b_3$, $b_5$, . . . are derived as follows.

$$b_1 = 2Vp/\pi \left\{ \begin{array}{l} \sin(\pi/3 - \phi) - \sin\phi - \\ \sin(\pi - \phi) + \sin(2\pi/3 + \phi) \end{array} \right\} \quad (4)$$

$$= 4Vp/\pi \{\sin(\pi/3 - \phi) - \sin\phi\}$$

∵ sin(π–ø)=sinø,
sin(2π/3+ø)=sin{π–(π/3–ø)}=sin(π/3–ø)

$$b_3 = 2Vp/(3\pi)\left\{ \begin{array}{l} \sin(\pi - 3\phi) - \sin 3\phi - \\ \sin(3\pi - 3\phi) + \sin(2\pi - 3\phi) \end{array} \right\} \quad (5)$$

$$= 2Vp/(3\pi)\{\sin 3\phi - \sin 3\phi - \sin 3\phi + \sin 3\phi\}$$

$$= 0$$

$$b_5 = 2Vp/(5\pi)\left\{ \begin{array}{l} \sin(5\pi/3 - 5\phi) - \sin 5\phi - \\ \sin(5\pi - 5\phi) + \sin(10\pi/3 + 5\phi) \end{array} \right\} \quad (6)$$

$$= 2Vp/(5\pi)\left[ \begin{array}{l} \sin\{\pi - (-2\pi/3 + 5\phi)\} - \sin 5\phi - \\ \sin(5\pi - 5\phi) + \sin\{\pi - (-\pi/3 - 5\phi)\} \end{array} \right]$$

$$= 2Vp/(5\pi)\left\{ \begin{array}{l} \sin(-2\pi/3 + 5\phi) - \\ 2\sin 5\phi + \sin(-\pi/3 - 5\phi) \end{array} \right\}$$

$$= 4Vp/(5\pi)\{\sin(-\pi/2)\cos(-\pi/6 - 5\phi) - 2\sin 5\phi\}$$

$$= -4Vp/(5\pi)\{\cos(\pi/6 + 5\phi) - 2\sin 5\phi\}$$

By assigning the equations (3) through (6) to the equation (2), the following equation is established:

$$y(t) = \sum_{n=1}^{\infty} b_n \cos n\omega t \quad (7)$$

$$= 4Vp/\pi \left\{ \begin{array}{l} \{\sin(\pi/3 - \phi) - \sin\phi\}\cos\omega t - 4Vp/(5\pi) \\ \{\cos(\pi/6 + 5\phi) - 2\sin 5\phi\}\cos 5\omega t + \ldots \end{array} \right\}$$

$$= Vp/\pi \left[ 4 \begin{array}{l} \{\sin(\pi/3 - \phi) - \sin\phi\}\cos\omega t - 4/5 \\ \{\cos(\pi/6 + 5\phi) - 2\sin 5\phi\}\cos 5\omega t + \ldots \end{array} \right]$$

As obvious from the equation (7), the harmonic components of y(t) always consist of the fifth harmonic wave or more, which do not include the third harmonic wave, irrespective of the value of ø. Accordingly, the cutoff frequency of the lowpass filter 22 is sufficient to be set to the fifth harmonic wave. In this way, since a relatively high cutoff frequency can be set, the inductance of the lowpass filter 22 may be small. Therefore, as an inductor, one which is small, light and inexpensive may be used. Depending on the case, the lowpass filter 22 itself may be omitted. In such a case, the driving circuit 20 consists solely of the discontinuous rectangle wave oscillator 21, that is, it includes an oscillating unit (FIG. 4) and a driving unit (FIG. 7) only.

Further, as obvious from the equation (4), the coefficient $b_1$ (that is, amplitude) of the fundamental wave can be changed by varying the phase difference ø. Therefore, a DC-DC converter for making the voltage Vp variable becomes unnecessary. The relationship between the phase difference ø and the coefficient $b_1$ can be shown as follows, from the equation (4):

$$b_1 = 4Vp/\pi\{\sin(\pi/3 - \phi) - \sin\phi\} \quad (8)$$

$$= 4Vp/\pi\{2\cos(\pi/6)\sin(\pi/6 - \phi)\}$$

$$= (4\sqrt{3}Vp/\pi)\sin(\pi/6 - \phi)$$

The relationship of the equation (8) is shown in FIG. 2. As obvious from FIG. 2, as the phase difference ø increases in a range between 0 and π/6, the coefficient $b_1$ of the fundamental wave decreases almost linearly. Note that in FIG. 2, the following line $$b_1' = (12\sqrt{3}Vp/\pi^2)(\pi/6 - \phi) \quad (9)$$

is indicated for comparison.

Further, in the case of ø=0, from the equation (7), y(t) is given by the following equation:

$$y(t) = Vp \bigg/ \prod \begin{bmatrix} 4\{\sin\prod/3 - \sin 0\}\cos\omega t - 4/5 \\ \{\cos\prod/6 - 2\sin 0\}\cos 5\omega t + \ldots \end{bmatrix} \quad (1)$$

$$= Vp \bigg/ \prod [2\sqrt{3}\cos\omega t - 2\sqrt{3}/5\cos 5\omega t + \ldots]$$

$$= (2\sqrt{3}Vp/\prod) \begin{bmatrix} \cos\omega t - (1/5)\cos 5\omega t + (1/7) \\ \cos 7\omega t + \ldots + (1/11)\cos 11\omega t + \ldots \end{bmatrix}$$

At this time, the coefficient $b_1$ of the fundamental wave becomes the maximum value $2\sqrt{3}Vp/\pi$. Relating to the discontinuous rectangle wave shown by the equation [1] and the rectangle wave shown by the aforementioned formula [2], harmonic components are shown in FIG. 3.

FIG. 4 is a circuit diagram showing an example of an oscillating unit in the driving circuit of FIG. 1. Hereinafter, explanation will be given based on this Fig. Note that "H level" means a high level, that is, a high voltage level (VDD), and "L level" means a low level, that is, a low voltage level (0).

The oscillating unit 30 includes a triangle wave generating circuit 31, a variable resistor 32, an inverting amplifier 33, comparators 34a and 34b, inverters 35a and 35b, ring counters 361 to 364, differentiating circuits 371a to 374b, OR gates 381 to 384, and RSS-FFs (flip-flop) 39a and 39b. The oscillating unit 30 outputs discontinuous rectangle wave generation signals V+ and V−.

The triangle wave generating circuit 31 is composed of a rectangle wave oscillator and an integrating circuit for example, and outputs a triangle wave voltage Vt1 to the inverting amplifier 33 and to a positive input terminal of the comparator 34a. The variable resistor 32 is, for example, a so-called "volume". In the case of volume, a knob is turned manually, whereby an arbitral resistance value is set. Then, a voltage corresponding to the resistance value is outputted to negative input terminals of the comparators 34a and 34b as a reference voltage Vr. The inverting amplifier 33 is composed of an operational amplifier 331 and resistors 332 and 333, and inverts the triangle wave voltage Vt1 and outputs it as a triangle wave voltage Vt2 to a positive input terminal of the comparator 34b.

The comparator 34a compares the reference voltage Vr with the triangle wave voltage Vt1, and outputs an H level signal when Vr≦Vt1, and outputs an L level signal when Vr>Vt1. The comparator 34b compares the reference voltage Vr with the triangle wave voltage Vt2, and outputs an H level signal when Vr≦Vt2, and outputs an L level signal when Vr>Vt2. An output signal of the comparator 34a serves as a clock pulse CP1 directly, and also becomes a clock pulse CP2 by being inverted by the inverter 35a. Similarly, an output signal from the comparator 34b serves as a clock pulse CP3 directly, and also becomes a clock pulse CP4 by being inverted by the inverter 35b.

The ring counter 361 includes an input terminal CLK1 to which the clock pulse CP1 is inputted, and three output terminals Q11 to Q13 from which H level signals are outputted sequentially each time the clock pulse CP1 is inputted. The configuration of the ring counters 362 to 364 is similar to the ring counter 361. Further, the ring counters 361 to 364 are provided with reset terminals (not shown) for obtaining synchronization (or setting an initial value). The differentiating circuits 371a to 374b are composed of capacitors and resistors for example, and convert output signals of the ring counters 361 to 364 to trigger signals of shorter pulse width, and output them to the OR gates 381 to 384.

The input terminals of the OR gate 381 are connected with an output terminal Q11 of the ring counter 361 and an output terminal Q31 of the ring counter 363. The input terminals of the OR gate 382 are connected with an output terminal Q21 of the ring counter 362 and an output terminal Q41 of the ring counter 364. The input terminals of the OR gate 383 are connected with an output terminal Q13 of the ring counter 361 and an output terminal Q32 of the ring counter 363. The input terminals of the OR gate 384 are connected with an output terminal Q23 of the ring counter 362 and an output terminal Q42 of the ring counter 364.

The RSS-FF 39a includes an input terminal Sa for setting connected with the output terminal of the OR gate 381, an input terminal Ra for resetting connected with the output terminal of the OR gate 382, and an output terminal Qa for outputting discontinuous rectangle wave generation signals V+. The RSS-FF 39b includes an input terminal Sb for setting connected with the output terminal of the OR gate 383, an input terminal Rb for resetting connected with the output terminal of the OR gate 384, and an output terminal Qb for outputting discontinuous rectangle wave generation signals V−. Note that in a general RS-FF, it is prohibited that both of a set input S and a reset input R become "1". On the other hand, in the RSS-FF, when both of a set input S and a reset input R become "1", the set input S is given priority, and "1" is outputted.

Figure 5:
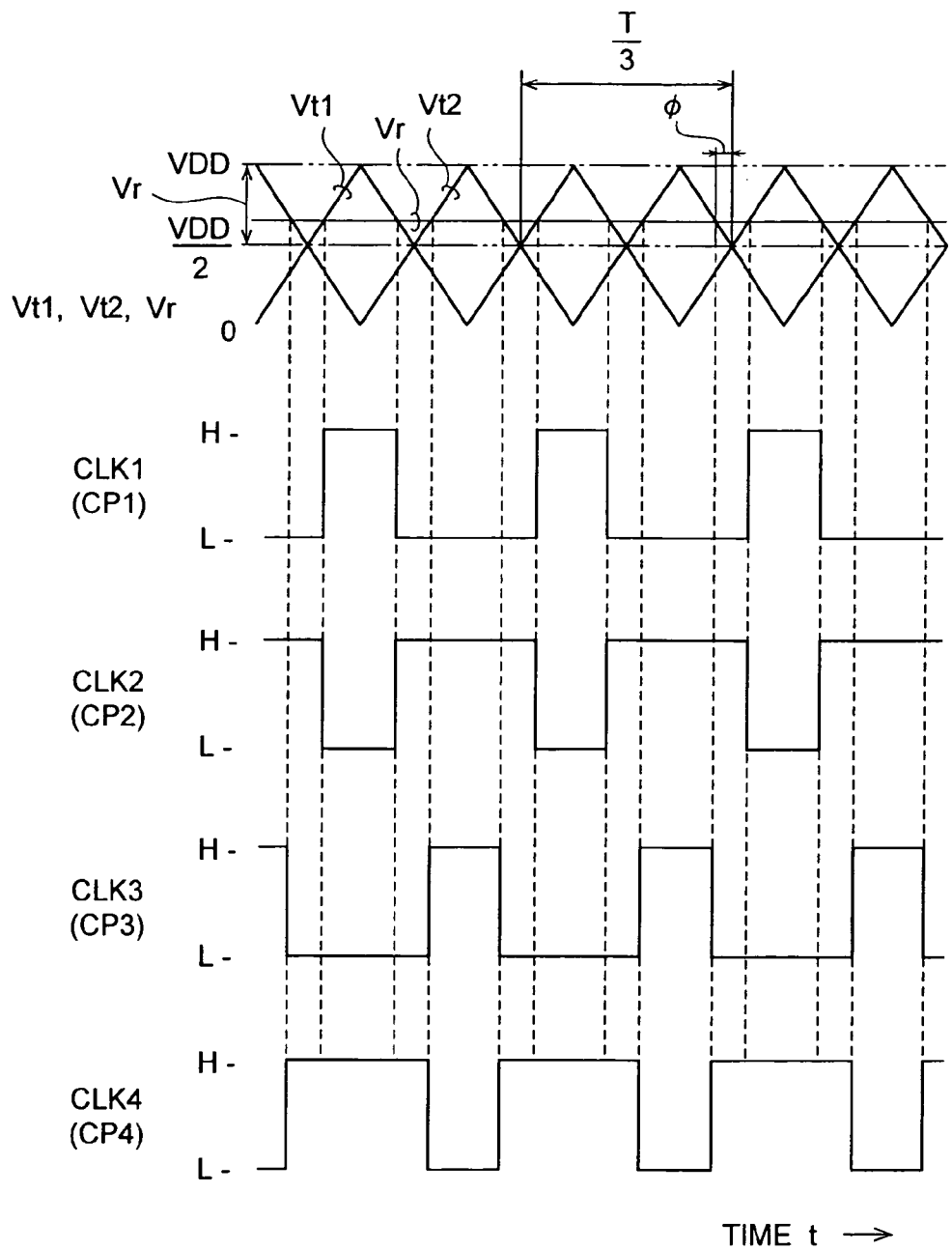
FIG. 5 is a timing chart (No. 1) showing respective output signals in the oscillating unit of FIG. 4.
Figure 6:
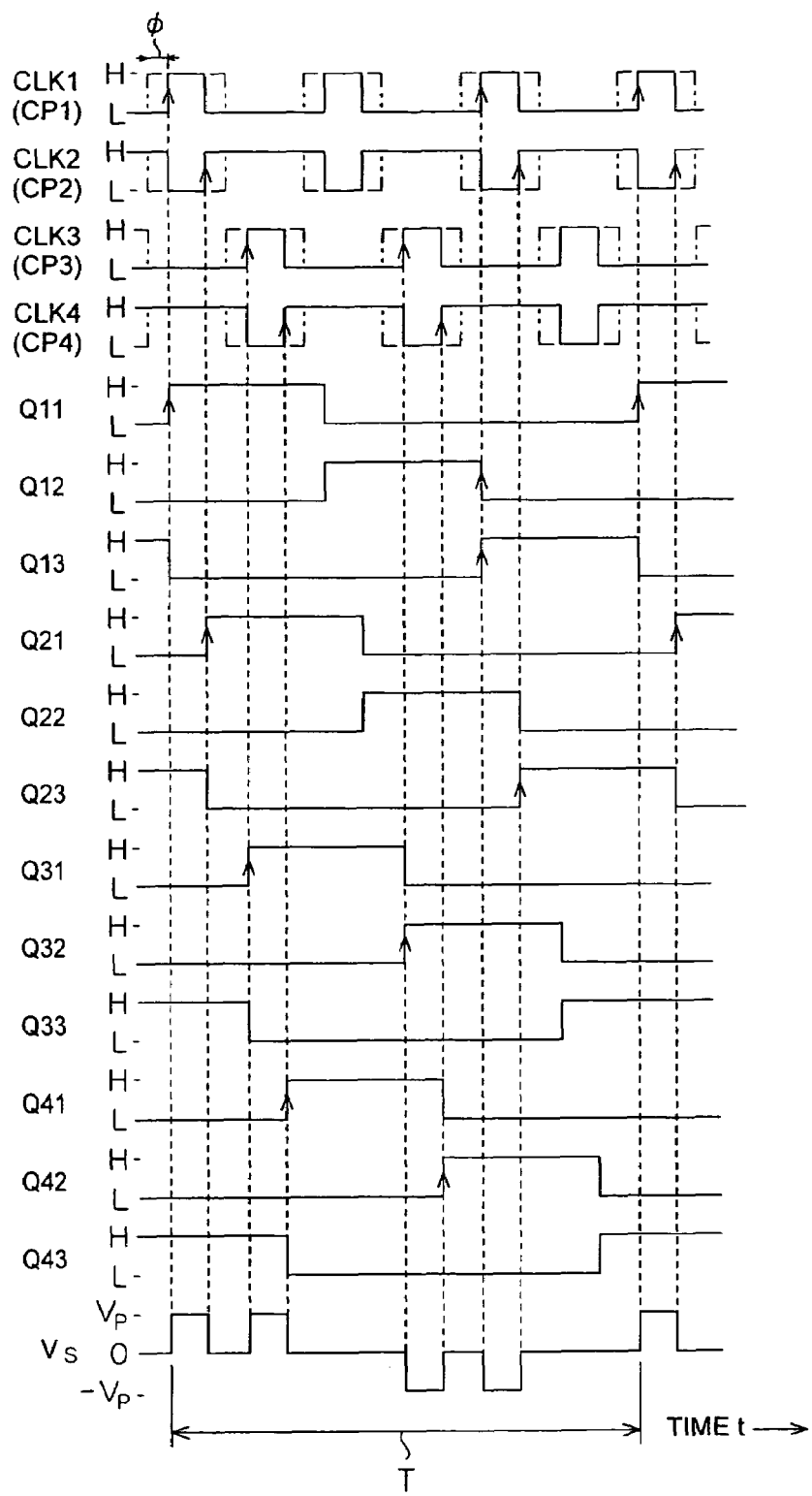
FIG. 6 is a timing chart (No. 2) showing respective output signals in the oscillating unit of FIG. 4.

FIGS. 5 and 6 are timing charts showing respective output signals in the oscillating unit of FIG. 4. Hereinafter, operation of the oscillating unit will be explained based on FIGS. 4 to 6.

The variable resistor 32 is applied with a power supply voltage VDD, and the reference voltage Vr is set to change from VDD/2 to VDD. On the other hand, the triangle wave voltage Vt1 is set to repeat from the minimum value 0 to the maximum value VDD cyclically, with T/3 being set as one cycle. Therefore, corresponding to the reference voltage Vr being changed from VDD/2 to VDD, the pulse width of the clock pulses CP1 to CP4 changes from T/6 to 0. That is, the phase difference ø varies from T/12 to 0.

The ring counters 361 to 364 and RSS-FFs 39a and 39b perform positive edge operation. First, in the ring counter 361, when the clock pulse CP1 is inputted continuously from the input terminal CLK1, H level signals are outputted sequentially from the output terminals Q11 to Q13. In the ring counter 362, when the clock pulse CP2 is inputted continuously from the input terminal CLK2, H level signals are outputted sequentially from the output terminals Q21 to Q23. In the ring counter 363, when the clock pulse CP3 is inputted continuously from the input terminal CLK3, H level signals are outputted sequentially from the output terminals Q31 to Q33. In the ring counter 364, when the clock pulse CP4 is inputted continuously from the input terminal CLK4, H level signals are outputted sequentially from the output terminals Q41 to Q43.

The RSS-FF 39a outputs discontinuous rectangle wave generation signals V+ of the H level during a period from the time that an H level signal is outputted from the output terminal Q11 to the time that an H level signal is outputted from the output terminal Q21, and during a period from the time that an H level signal is outputted from the output terminal Q31 to the time that an H level signal is outputted from the output terminal Q41. The RSS-FF 39b outputs discontinuous rectangle wave generation signals V− of the H level during a period from the time that an H level signal is outputted from the output terminal Q32 to the time that an H level signal is outputted from the output terminal Q42, and during a period from the time that an H level signal is outputted from the output terminal Q13 to the time that an H level signal is outputted from the output terminal Q23.

Note that when the phase difference ø=0, in the RSS-FF 39a, H level signals are inputted simultaneously into the input terminal Sa for setting and the input terminal Ra for resetting. At this time, the RSS-FF39a gives priority to the H level signal of the input terminal Sa for setting to thereby output discontinuous rectangle wave generation signals V+ of the H level. Thereby, adjacent two discontinuous rectangle wave generation signals V+ of the H level becomes one without being interrupted. The operation of the RSS-FF 39b is similar to this one.

FIG. 7 is a circuit diagram showing an example of a driving unit in the driving circuit of FIG. 1. Hereinafter, explanation will be given based on this Fig.

A driving unit 40 of the present invention consists of a so-called H-type bridge circuit including transistors 41 and 42 of P-channel power MOS and transistor 43 and 44 of N-channel power MOS. Based on discontinuous rectangle wave generation signals V+ and V−, the discontinuous rectangle wave voltage Vs is applied to the first electrodes 12 and 13 of the piezoelectric transformer 10. The lowpass filter 22 consisting of the inductor 23 is interposed between the driving unit 40 and the piezoelectric transformer 10. To the output side of the piezoelectric transformer 10, a load 50 is connected.

Gates of the transistors 41 and 43 are applied with discontinuous rectangle wave generation signals V+, and gates of the transistors 42 and 44 are applied with discontinuous rectangle wave generation signals V−. Therefore, when the discontinuous rectangle wave generation signals V+ are in the H level, the transistor 41 becomes off and the transistor 43 becomes on. In contrast, when the discontinuous rectangle wave generation signals V+ are in the L level, the transistor 41 becomes on and the transistor 43 becomes off. Similarly, when the discontinuous rectangle wave generation signals V− are in the H level, the transistor 42 becomes off and the transistor 44 becomes on. In contrast, when the discontinuous rectangle wave generation signals V− are in the L level, the transistor 42 becomes on and the transistor 44 becomes off.

Therefore, when both discontinuous rectangle wave generation signals V+ and V− are in the L level, both transistors 43 and 44 become off, whereby the voltage applied to the primary electrodes 12 and 13 is 0. When the discontinuous rectangle wave generation signals V+ are in the H level and the discontinuous rectangle wave generation signals V− are in the L level, the transistors 42 and 43 become on and the transistors 41 and 44 become off, whereby the voltage applied to the primary electrodes 12 and 13 is Vp. In contrast, when the discontinuous rectangle wave generation signals V+ are in the L level and the discontinuous rectangle wave generation signals V− are in the H level, the transistors 42 and 43 become off and the transistors 41 and 44 become on, whereby the voltage applied to the primary electrodes 12 and 13 is −Vp. Therefore, the voltage applied to the primary electrodes 12 and 13 based on the discontinuous rectangle wave generation signals V+ and V− becomes a discontinuous rectangle wave voltage Vs as shown in FIG. 6.

Needless to say, the present invention is not limited to the above-described embodiment. For example, an oscillating unit and a driving unit may have other circuit configurations.

Availability of the Invention

According to the driving method and the driving circuit of a piezoelectric transformer of the present invention, by applying specific discontinuous rectangle wave voltage to primary electrodes of the piezoelectric transformer, it is possible to eliminate the third harmonic wave outputted to the piezoelectric transformer. Thereby, reduction in size, reduction in weight, and reduction in price of the lowpass filter, or omission thereof can be achieved. Further, the amplitude of the fundamental wave can be varied by changing the phase difference ø of the discontinuous rectangle wave, whereby a DC-DC converter is not required. In other words, the inductance of a lowpass filter can be reduced, and also the amplitude of the fundamental wave can be changed without using a DC-DC converter.

What is claimed is:

1. A driving method of a piezoelectric transformer for applying voltage of a discontinuous rectangle wave, composed of a potential $V_0$, a potential $V_H$ which is higher than the potential $V_0$ and a potential $V_L$ which is lower than the voltage $V_0$, to a primary electrode of the piezoelectric transformer, wherein assuming one cycle is T, the discontinuous rectangle wave has such a configuration that a potential from a time 0 to a time ø is the potential $V_0$, from the time ø to a time (T/6−ø) is the potential $V_H$, from the time (T/6−ø) to a time (T/3+ø) is the potential $V_0$, from the time (T/3+ø) to a time (T/2−ø) is the potential $V_L$, from the time (T/2−ø) to a time (T/2+ø) is the potential $V_0$, from the time (T/2+ø) to a time (2T/3−ø) is the potential $V_L$, from the time (2T/3−ø) to a time (5T/6+ø) is the potential $V_0$, from the time (5T/6+ø) to a time (T−ø) is the potential $V_H$, and from the time (T−ø) to a time T is the potential $V_0$, and a phase difference ø is $0 \leq ø \leq T/12$.

2. The driving method of the piezoelectric transformer as claimed in claim 1, wherein a frequency component not less than a fifth harmonic wave, included in the discontinuous rectangle wave, is removed by using a lowpass filter, and then the discontinuous rectangle wave is applied to the primary electrode of the piezoelectric transformer.

3. A driving method of a piezoelectric transformer for applying voltage of a discontinuous rectangle wave, composed of a potential 0, a potential +1 which is higher by a certain voltage than the potential 0 and a potential −1 which is lower by a certain voltage than the voltage 0, to a primary electrode of the piezoelectric transformer, wherein assuming one cycle is T, the discontinuous rectangle wave has such a configuration that a potential from a time 0 to a time ø is the potential 0, from the time ø to a time (T/6−ø) is the potential +1, from the time (T/6−ø) to a time (T/3+ø) is the potential 0, from the time (T/3+ø) to a time (T/2−ø) is the potential −1, from the time (T/2−ø) to a time (T/2+ø) is the potential 0, from the time (T/2+ø) to a time (2T/3−ø) is the potential −1, from the time (2T/3−ø) to a time (5T/6+ø) is the potential 0, from the time (5T/6+ø) to a time (T−ø) is the potential +1, and from the time (T−ø) to a time T is the potential 0, and a phase difference ø is $0 \leq ø \leq T/12$.

4. The driving method of the piezoelectric transformer as claimed in claim 3, wherein a frequency component not less than a fifth harmonic wave, included in the discontinuous rectangle wave, is removed by using a lowpass filter, and then the discontinuous rectangle wave is applied to the primary electrode of the piezoelectric transformer.

5. A driving circuit of a piezoelectric transformer, comprising a discontinuous rectangle wave oscillator for outputting voltage of a discontinuous rectangle wave which is applied to a primary electrode of the piezoelectric transformer, wherein the discontinuous rectangle wave is composed of a potential $V_0$, a potential $V_H$ which is higher than the potential $V_0$ and a potential $V_L$ which is lower than the voltage $V_0$, and assuming one cycle is T, the discontinuous rectangle wave has such a configuration that a potential from a time 0 to a time ø is the potential $V_0$, from the time ø to a time (T/6−ø) is the potential $V_H$, from the time (T/6−ø) to a time (T/3+ø) is the potential $V_0$, from the time (T/3+ø) to a time (T/2−ø) is the potential $V_L$, from the time (T/2−ø) to a time (T/2+ø) is the potential $V_0$, from the time (T/2+ø) to a time (2T/3−ø) is the potential $V_L$, from the time (2T/3−ø) to a time (5T/6+ø) is the potential $V_0$, from the time (5T/6+ø) to a time (T−ø) is the potential $V_H$, and from the time (T−ø) to a time T is the potential $V_0$, and a phase difference ø is $0 \leq ø \leq T/12$.

6. The driving circuit of the piezoelectric transformer as claimed in claim 5, further comprising a lowpass filter, interposed between the rectangle wave oscillator and the piezoelectric transformer, for removing a frequency component not less than a fifth harmonic wave, included in the discontinuous rectangle wave outputted from the rectangle wave oscillator, and then outputting the discontinuous rectangle wave to the piezoelectric transformer.

7. A driving circuit of a piezoelectric transformer, comprising a discontinuous rectangle wave oscillator for outputting voltage of a discontinuous rectangle wave which is applied to a primary electrode of the piezoelectric transformer, wherein the discontinuous rectangle wave is composed of a potential 0, a potential +1 which is higher by a certain voltage than the potential 0 and a potential −1 which is lower by a certain voltage than the voltage 0, and assuming one cycle is T, the discontinuous rectangle wave has such a configuration that a potential from a time 0 to a time ø is the potential 0, from the time ø to a time (T/6−ø) is the potential +1, from the time (T/6−ø) to a time (T/3+ø) is the potential 0, from the time (T/3+ø) to a time (T/2−ø) is the potential −1, from the time (T/2−ø) to a time (T/2+ø) is the potential 0, from the time (T/2+ø) to a time (2T/3−ø) is the potential −1, from the time (2T/3−ø) to a time (5T/6+ø) is the potential 0, from the time (5T/6+ø) to a time (T−ø) is the potential +1, and from the time (T−ø) to a time T is the potential 0, and a phase difference ø is $0 \leq ø \leq T/12$.

8. The driving circuit of the piezoelectric transformer as claimed in claim 7, further comprising a lowpass filter, interposed between the rectangle wave oscillator and the piezoelectric transformer, for removing a frequency component not less than a fifth harmonic wave, included in the discontinuous rectangle wave outputted from the rectangle wave oscillator, and then outputting the discontinuous rectangle wave to the piezoelectric transformer.

9. A driving method of a piezoelectric transformer comprising:

a pulse generating step for generating a driving pulse of a fundamental wave by alternating polarities of rectangle pulses, in a double-humped shape, which form a unit; and a voltage applying step for applying voltage based on the driving pulse of the fundamental wave generated in the pulse generating step to a primary electrode of the piezoelectric transformer.

10. The driving method of the piezoelectric transformer as claimed in claim 9, wherein the driving pulse in which amplitude is changed is generated by varying a phase difference with respect to the fundamental wave.

11. The driving method of the piezoelectric transformer as claimed in claim 9, wherein a frequency component not less than a fifth harmonic wave, included in the driving pulse, is filtered.

12. A driving circuit of a piezoelectric transformer comprising:

an oscillating unit; and a driving unit, wherein the oscillating unit generates a driving pulse of a fundamental wave by alternating polarities of rectangle pulses, in a double-humped shape, which forms a unit, and the driving unit applies a voltage based on the driving pulse of the fundamental wave generated by the oscillating unit to a primary electrode of the piezoelectric transformer.

13. The driving circuit of the piezoelectric transformer as claimed in claim 12, wherein the oscillating unit has a function of generating the driving pulse in which the amplitude is changed by varying the phase difference with respect to the fundamental wave.

14. The driving circuit of a piezoelectric transformer as claimed in claim 12, comprising a lowpass filter for filtering a frequency component not less than a fifth harmonic wave included in the driving pulse.

* * * * *